(12) United States Patent
Ye et al.

(10) Patent No.: US 10,578,933 B2
(45) Date of Patent: Mar. 3, 2020

(54) DISPLAY DEVICE AND MANUFACTURING METHOD THEREOF

(71) Applicant: Samsung Display Co., Ltd., Yongin-Si, Gyeonggi-Do (KR)

(72) Inventors: Byoungdae Ye, Yongin-si (KR); Donghyeon Lee, Seoul (KR); Junwoo You, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 36 days.

(21) Appl. No.: 15/961,966

(22) Filed: Apr. 25, 2018

(65) Prior Publication Data

US 2019/0049771 A1 Feb. 14, 2019

(30) Foreign Application Priority Data

Aug. 11, 2017 (KR) .......................... 10-2017-0102609

(51) Int. Cl.
| | |
|---|---|
| *G02F 1/1345* | (2006.01) |
| *G02F 1/1343* | (2006.01) |
| *G09G 3/36* | (2006.01) |
| *H01L 27/12* | (2006.01) |

(52) U.S. Cl.
CPC .... *G02F 1/13458* (2013.01); *G02F 1/134309* (2013.01); *G09G 3/3688* (2013.01); *H01L 27/12* (2013.01); *G02F 2201/121* (2013.01)

(58) Field of Classification Search
CPC combination set(s) only.
See application file for complete search history.

(56) References Cited

U.S. PATENT DOCUMENTS

| | | |
|---|---|---|
| 9,098,132 B2 | 8/2015 | Shim et al. |
| 9,123,593 B2 | 9/2015 | Kang et al. |
| 2015/0179670 A1* | 6/2015 | Kang .................... H01L 27/124 257/773 |

FOREIGN PATENT DOCUMENTS

| | | |
|---|---|---|
| KR | 1020140136233 A | 11/2014 |
| KR | 1020150047711 A | 5/2015 |

\* cited by examiner

*Primary Examiner* — Deeprose Subedi
(74) *Attorney, Agent, or Firm* — Cantor Colburn LLP

(57) ABSTRACT

A display device includes a substrate of a display panel, including: a display area and a non-display area, an upper surface and a lower surface each in the display area and the non-display area, and side surfaces connecting the upper and lower surfaces to each other; a signal line on the upper surface of the substrate; a circuit substrate on a side surface of the substrate; and a connection electrode on the upper surface of the substrate in the non-display area thereof, where the connection electrode electrically connects the signal line and the circuit substrate to each other. In the non-display area, the substrate further includes: a first etched portion recessed from the side surface at which the circuit substrate is disposed, and a second etched portion extending from the first etched portion toward the signal line, and the connection electrode is in the first and second etched portions.

16 Claims, 12 Drawing Sheets

DISPLAY DEVICE AND MANUFACTURING METHOD THEREOF

This application claims priority to Korean Patent Application No. 10-2017-0102609, filed on Aug. 11, 2017, and all the benefits accruing therefrom under 35 U.S.C. § 119, the content of which in its entirety is herein incorporated by reference.

BACKGROUND

(1) Field

The present disclosure herein relates to a display device, and more particularly to a display device and a manufacturing method thereof.

(2) Description of the Related Art

Typically, a display panel and a driving chip of a display device are electrically connected to each other within a module assembly equipment in a process performed after forming the display panel. This combining process for electrically connecting the display panel and driving chip to each other is largely classified into a chip on lass ("COG") scheme and a tape automated bonding ("TAB") scheme according to a driving chip mounting scheme.

The COG scheme is for directly mounting a driving chip on a gate area and a data area of a display panel and delivering an electrical signal to the display panel. The driving chip is typically bonded to the display panel using an anisotropic conductive film ("ACF").

The TAB scheme is for bonding, to a display panel, a tape carrier package on which a driving chip is mounted. In this scheme, the display panel is bonded to one end of the tape carrier package using an ACF and a main circuit substrate is bonded to the other (opposing) end of the tape carrier package.

In order to extend and maximize a display area of a display device on which an image is displayed, a structure is being studied in which a tape carrier package is disposed on a side of the display panel.

SUMMARY

The present disclosure provides a display device in which a non-display area may be reduced and a display area may be increased.

An embodiment of the invention provides a display device including: a substrate of a display panel which displays an image with light, the substrate including: a display area at which the image is displayed and a non-display area at which the image is not displayed, an upper surface disposed in both the display area and the non-display area, a lower surface facing the upper surface, disposed in both the display area and the non-display area, and a plurality of side surfaces connecting the upper surface and the lower surface to each other; a signal line which receives a signal at the non-display area and provides the received signal to the display area, the signal line disposed on the upper surface of the substrate; a circuit substrate from which the signal is provided to the signal line, the circuit substrate disposed on a side surface among the side surfaces of the substrate; and a connection electrode disposed on the upper surface of the substrate in the non-display area thereof, where the connection electrode electrically connects the signal line and the circuit substrate to each other. In the non-display area, the substrate further includes: a first etched portion recessed from the side surface at which the circuit substrate is disposed, and a second etched portion extending from the first etched portion toward the signal line, and the connection electrode is disposed in the first etched portion and the second etched portion.

In an embodiment, the upper surface may include a horizontal portion on which the signal line is disposed, the horizontal portion disposed in a plane defined by first and second directions, and the second etched portion in which the connection electrode is disposed is inclined from the horizontal portion to the first etched portion.

In an embodiment, the lower surface may include a first portion facing the horizontal portion, and a second portion inclined from the first portion and connecting the first portion to the side surface.

In an embodiment, the display device may further include an auxiliary connection electrode disposed on the connection electrode and electrically contacting the signal line and the connection electrode.

In an embodiment, the substrate may further include an auxiliary etched portion extended from the inclined second etched portion to the signal line, the auxiliary etched portion recessed from the horizontal portion in the thickness direction, and the connection electrode disposed in the second etched portion may be further disposed in the auxiliary etched portion.

In an embodiment, the signal line disposed on the horizontal portion of the upper surface may extend to be disposed on the connection electrode disposed in the auxiliary etched portion.

In an embodiment, in the thickness direction, the second etched portion may be recessed from the horizontal portion of the upper surface and extend from the horizontal portion to terminate at the side surface at which the circuit substrate is disposed.

In an embodiment, the signal line may include a pad at a terminal end thereof, the pad being adjacent to the side surface at which the circuit substrate is disposed, and a conductive line which is connected to the pad and extends to the display area.

In an embodiment, the circuit substrate may include a pad through which the signal is provided from the circuit substrate to the pad of the signal line, and at the first etched portion, the pad of the circuit substrate may be electrically connected to and faces the connection electrode.

In an embodiment, the display device may further include an isotropic conductive film disposed between the pad of the circuit substrate and the connection electrode.

In an embodiment, the display device may further include an upper substrate facing the substrate on which the signal line is disposed, and a substrate combining member which couples the upper substrate to the substrate on which the signal line is disposed. At the second etched portion, the signal line may be disposed between the connection electrode and the substrate combining member.

In an embodiments of the invention, a display device includes: a substrate of a display panel which displays an image with light, the substrate including: a display area at which the image is displayed and a non-display area at which the image is not displayed, an upper surface disposed in both the display area and the non-display area, a lower surface facing the upper surface, disposed in both the display area and the non-display area, and a plurality of side surfaces connecting the upper surface and the lower surface to each other; a signal line which receives a signal at the non-display area and provides the received signal to the display area, the signal line disposed on the upper surface of the substrate; a circuit substrate from which the signal is provided to the signal line, the circuit substrate disposed on a side surface among the side surfaces of the substrate; and a connection electrode disposed on the upper surface of the substrate in the non-display area thereof, where the connection electrode electrically connects the signal line and the circuit substrate to each other. In the non-display area, the upper surface includes a horizontal portion, and an inclined portion which is inclined from the horizontal portion and connects the horizontal portion and the side surface on which the circuit substrate is disposed to each other, the signal line is disposed on the horizontal portion of the upper surface, and the connection electrode is disposed on the inclined portion of the upper surface and extends toward the lower surface along the side surface on which the circuit substrate is disposed.

In an embodiment, the lower surface may include a first portion facing the horizontal portion, and a second portion inclined from the first portion and connecting the first portion and the side surface to each other.

In an embodiment, the signal line may include a pad at a terminal end thereof, the pad contacting the connection electrode, and a conductive line which is connected to the pad and extends to the display area, and an end surface of the connection electrode may face and contact an end surface of the pad of the signal line.

In an embodiment, the circuit substrate may include a pad electrode through which the signal is provided from the circuit substrate to the signal line, and the pad electrode may be electrically connected to and face the connection electrode disposed on the side surface.

In an embodiment, the display device may further include a conductive adhesive member disposed between the pad electrode of the circuit substrate and the connection electrode disposed on the side surface.

In an embodiments of the invention, a manufacturing method of a display device, includes: etching a first portion of a substrate of display panel which displays an image with light, at an upper surface of the substrate, the etching the first portion reducing a thickness of the substrate at a non-display area of the display panel; etching a second portion of the substrate, a side surface thereof, the second portion extending from the first portion to be connected therewith; disposing a connection electrode in the first etched portion and in the second etched portion of the substrate; disposing outside of the first and second etched portions of the substrate, a signal line on the upper surface, to contact the connection electrode disposed in the first and second etched portions; and disposing a circuit substrate on the side surface at which the second portion is etched to be electrically connected to the connection electrode disposed in the first and second etched portions.

In an embodiment, the signal line outside of the first and second etched portions of the substrate may extend to be disposed overlapping the connection electrode disposed in the first and second etched portions.

In an embodiment, the upper surface may include a horizontal portion on which the signal line is disposed, the horizontal portion disposed in a plane defined by first and second direction, and the first etched portion in which the connection electrode is disposed may be inclined from the horizontal portion to the second etched portion.

In an embodiment, an end surface of the connection electrode may face and contact an end surface of the signal line.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
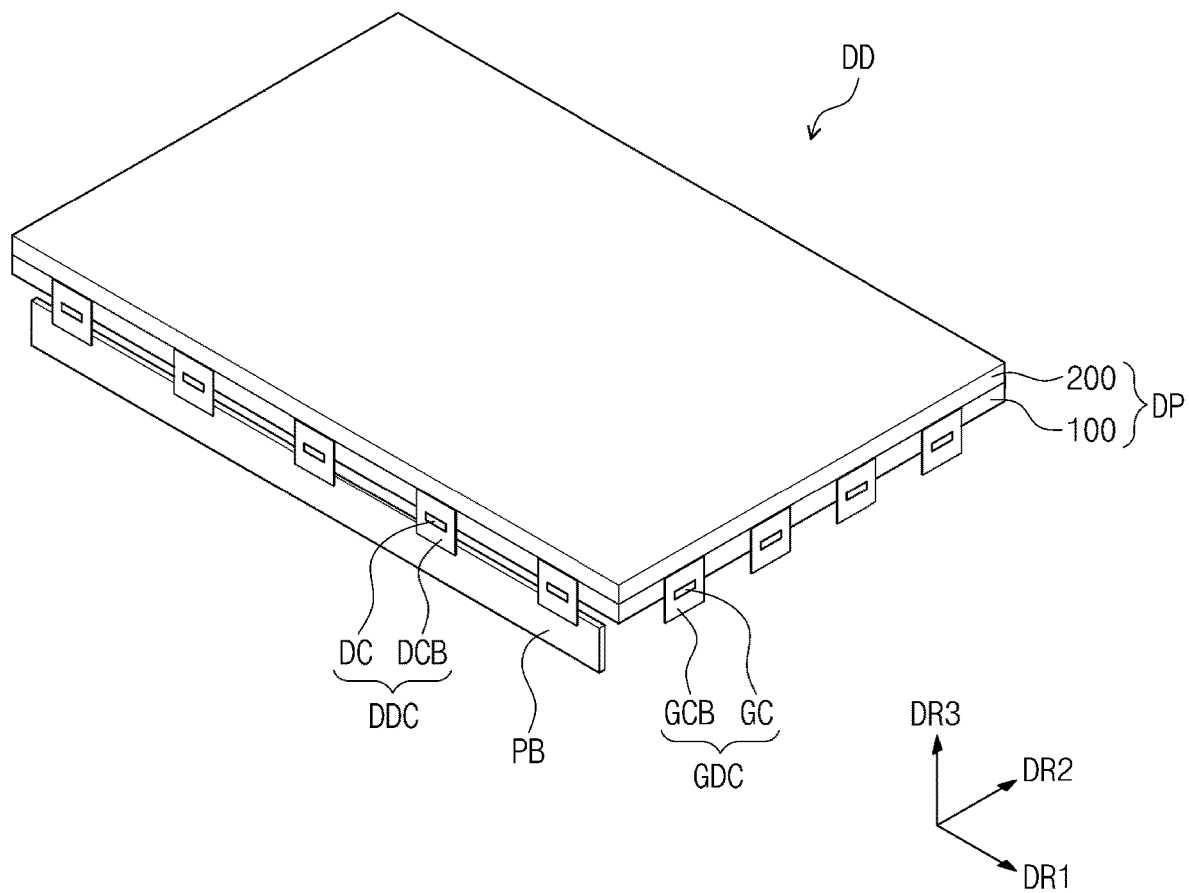
FIG. 1 is a perspective view of an embodiment of a display device according to the invention.

The invention may be subjected to many modifications and have several forms, and specific embodiments thereof are illustrated in the drawings and described in detail in the specification. However, it will be understood that the invention is not intended to be limited to the specific forms set forth herein, and all changes, equivalents, and substitutions included in the technical scope and spirit of the invention are included.

Referring to the drawings, like reference numerals refer to like components throughout. In the drawings, the dimensions of the structures may be exaggerated or reduced for clarity of illustration. Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the invention.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

The singular forms "a," "an" and "the" are intended to include the plural forms as well, unless the context clearly indicates otherwise. "At least one" is not to be construed as limiting "a" or "an." "Or" means "and/or." As used herein, the term "and/or" includes any and all combinations of one or more of the associated listed items.

It will be understood that the terms "comprises" or "have," when used in this specification, are intended to specify the presence of stated features, integers, steps, operations, components, a combination thereof, but do not preclude the presence or addition of one or more other features, integers, steps, operations, components, or a combination thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
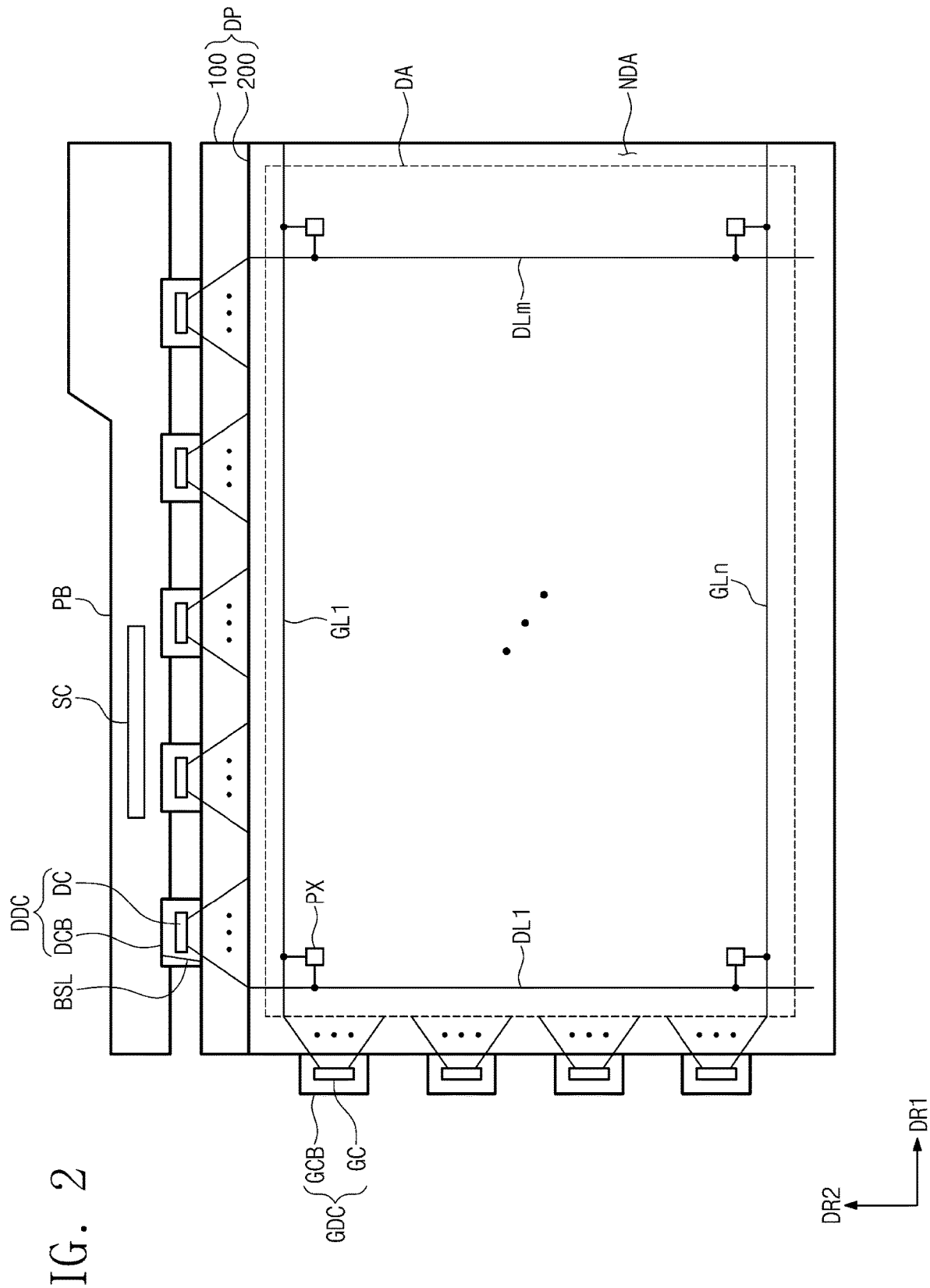
FIG. 2 is a top plan view of the display device according to the invention.
Figure 3:
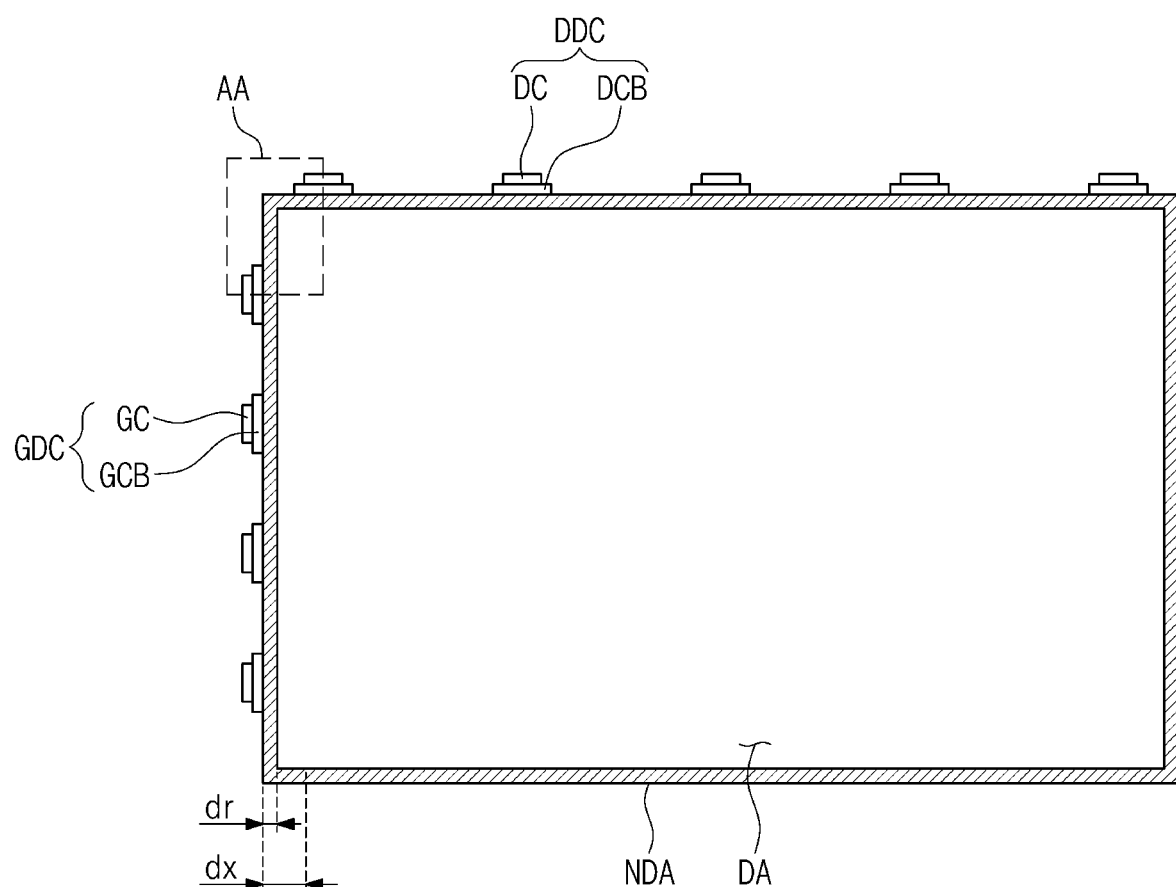
FIG. 3 is a top plan view of an embodiment of a display panel according to the invention.

FIG. 1 is a perspective view of an embodiment of a display device according to the invention. FIG. 2 is a top plan view of the display device according to the invention. FIG. 3 is a top plan view of an embodiment of a display panel according to the invention.

Referring to FIGS. 1 and 2, the display device DD includes the display panel DP, a main circuit substrate PB, a gate driving unit GDC, a data driving unit DDC and a signal control unit SC.

According to an embodiment of the invention, the display device DD may be applied in a relatively small electronic device such as a mobile phone, a tablet (computer/processor), a game console or a smart watch as well as a middle- or relatively large-sized electronic device such as a notebook (computer/processor) or a television.

According to an embodiment of the invention, the display panel DP may be provided as any one of an organic light emitting display panel, a liquid crystal display panel, a plasma display panel, an electrophoretic display panel, a microelectromechanical system ("MEMS") display panel and an electrowetting display panel.

In detail, the display panel DP may include a first (display) substrate 100 and a second (display) substrate 200 which is disposed on the first display substrate 100. The first substrate 100 and the second substrate 200 may be provided as including a glass (base) substrate or a plastic (base) substrate. As used herein, reference numerals 100 and 200 may be used to indicate the overall first or second substrate, as well as the respective base substrate thereof on which other layers or elements are disposed.

As an example, when the display panel DP is implemented as a liquid crystal panel, a liquid crystal layer as an optical medium or light transmittance control layer may be disposed between the first substrate 100 and the second substrate 200.

As another example, when the display panel DP is implemented as an organic electroluminescent display panel, a (display) circuit layer including light emitting unit elements which generate and emit light may be disposed in the first substrate 100 such as on the base substrate thereof. In this case, the second substrate 200 may be provided as an encapsulation substrate or a thin film encapsulation layer covering elements of the circuit layer. In addition, although not shown in the drawings, an input sensing unit for sensing an external input may be disposed on or in the display panel DP. In an embodiment, for example, the external input may mean a touch from an external object to the input sensing unit and/or the display panel DP.

The display panel DP is disposed in a plane which is parallel to a surface or plane defined by a first direction DR1 and a second direction DR2 crossing each other. A normal direction relative to the plane of the display panel DP is indicated by a third direction DR3. The third direction DR3 indicates a thickness direction of the display device and/or components thereof. A front surface and a rear surface of each member are defined opposing each other along the third direction DR3. However, directions indicated by the first to third directions DR1, DR2 and DR3 are relative, and may be converted to other directions.

Referring to FIG. 2, the first substrate 100 includes a plurality of gate lines GL1 to GLn and a plurality of data lines DL1 to DLm which intersect with the gate lines GL1 to GLn. In addition, the first substrate 100 includes a pixel PX provided in plurality connected to the gate lines GL1 to GLn and data lines DL1 to DLm. The gate lines GL1 to GLn are connected to the gate driving unit GDC. The data lines DL1 to DLm are connected to the data driving unit DDC.

For convenience of explanation, FIG. 2 only illustrates a portion of the plurality of gate lines GL1 to GLn and a portion of the plurality of data lines DL1 to DLm.

In addition, FIG. 2 also only illustrates a portion of the plurality of pixels PX. Each pixel PX is connected to a corresponding gate line among the gate lines GL1 to GLn and to a corresponding data line among the data lines DL1 to DLm.

The pixels PX may be classified into a plurality of groups according to a color displayed thereby. In other words, the pixels PX may respectively display one of primary colors. The primary colors may include green, blue and white.

However, the primary colors are not limited thereto, and may further include various colors such as yellow, cyan and magenta.

The signal control unit SC may be mounted on the main circuit substrate PB. As an embodiment of the invention, the signal control unit SC is illustrated to be mounted on the main circuit substrate PB, but the signal control unit SC may be mounted on an external circuit substrate (not shown). In this case, the external circuit substrate may be an element separate from the main circuit substrate PB and electrically connected to the main circuit substrate PB.

The signal control unit SC may receive image data and a control (driving) signal from an external graphic control unit (not shown). The control signal may include a vertical synchronizing signal that is a signal for distinguishing frame periods from each other, a signal for distinguishing horizontal periods, namely, horizontal blanking signal that is a row distinguishing signal, a data enable signal that has a relatively high level only during a data output period in order to indicate a data input area and a clock signal. However, the control signal is not limited thereto, and may further include a plurality of signals for driving the gate driving unit GDC and the data driving unit DDC.

In response to the control signal, the signal control unit SC generates a gate control signal for controlling the gate driving unit GDC, and delivers the gate control signal to the gate driving unit GDC. The signal control unit SC generates a data control signal for controlling the data driving unit DDC and delivers the data control signal to the data driving unit DDC.

The gate driving unit GDC is provided in plurality and generates gate signals during the frame periods on the basis of the gate control signal provided thereto. The gate driving unit GDC outputs the gate signals to the gate lines GL1 to GLn. The gate signals may be sequentially output in response to horizontal periods. In addition, although not shown in the drawings, a gate circuit substrate GCB may be provided in plurality electrically connected to each other.

It is described that the gate driving unit GDC according to an embodiment of the invention is an individual unit provided in plurality, but is not limited thereto. In other words, the gate driving unit GDC may be provided in a single unitary gate driving unit GDC to generate the gate signals. In an embodiment, for example, the display device DD including one single gate driving unit GDC may be applied to a mobile phone, etc.

The gate driving unit GDC may include a gate driving chip GC and the gate circuit substrate GCB on which the gate driving chip GC is mounted. The gate driving chip GC may be provided in plurality. As an example, the gate circuit substrate GCB may be provided as a flexible printed circuit and may be provided in one-to-one correspondence with the gate driving chips GC, to form a plurality of gate driving units GDC.

According to an embodiment of the invention, the gate circuit substrate GCB may be disposed at one side among a plurality of sides of the display panel DP defined in the top plan view. The gate circuit substrate GCB is electrically connected to the gate lines GL1 to GLn to deliver the gate signals output from the gate driving chip GC to the gate lines GL1 to GLn.

According to an embodiment of the invention, the gate driving unit GDC and the data driving unit DDC may be provided as a tape carrier package ("TCP").

In a conventional structure, in a typical case, a pad unit of the gate circuit substrate GCB is disposed on the first substrate 100 of the display panel DP such as in a non-display area NDA thereof. In this case, a top surface of the display panel DP essentially includes a pad area at which a pad unit of the gate circuit substrate GCB is disposed. A display area DA of the display panel DP is an area at which an image is displayed with emitted light, and the non-display area NDA is an area at which the image is not displayed. Light may be generated and emitted at the display area DA, without being limited thereto.

According to one or more embodiment of the invention, as the gate circuit substrate GCB is disposed on one side surface among a plurality of side surfaces of the display panel DP, a planar area of the top surface of the first substrate 100 at which the pad unit of the gate circuit substrate GCB is disposed is obviated. That is, the non-display area NDA is reduced as omitting the planar area for the pad unit of the gate circuit substrate GCB.

Sides of the display device DD lengthwise extend in a direction. As illustrated in FIG. 3, in a conventional structure, the non-display area NDA of the display panel DP includes a first area dx at which the pad unit of the gate circuit substrate GCB is to be disposed. In other words, the non-display area NDA at a side of the display device DD is defined by a product of the width (dx) along the first direction DR1 and a length along the second direction DR2, such as along an entire length in the second direction DR2.

However, for one or more embodiment of the invention, since the pad unit of the gate circuit substrate is not disposed to occupy a planar area of the first substrate 100 at the non-display area NDA of the display panel DP, the non-display area NDA may be reduced from the first area dx to a second area dr in the first direction DR1. Again, the non-display area NDA at a side of the display device DD is defined by a product of the width (dr) along the first direction DR1 and a length along the second direction DR2, such as along an entire length in the second direction DR2. Since dr is smaller than dx, a total planar area of the non-display area NDA is reduced as compared with the conventional structure described above.

In other words, since the gate circuit substrate GCB in one or more embodiment of the invention is not disposed on the top surface of the substrate of the display panel DP, the non-display area NDA may be generally reduced. Accordingly, with the reduction of the non-display area NDA, the display area DA of the display panel DP according to one or more embodiment of the invention may be increased as compared to that of the conventional structure.

The display area DA and the non-display area NDA may be defined by portions of a top surface of a (display) substrate at which an image is substantially displayed, not portions of a side surface of the display panel DP. Accordingly, in a same-sized display panel, when the non-display area NDA is further reduced, the display area DA on which an image is displayed may be increased.

The data driving unit DDC may be provided in plurality. The data driving unit DDC generates grayscale voltages according to image data provided from the signal control unit SC on the basis of a data control signal received from the signal control unit SC. The data driving unit DDC outputs the grayscale voltages to the data lines DL1 to DLm as the data signals.

The data driving unit DDC is described as provided in plurality, but is not limited thereto. In other words, the data driving unit DDC may be provided in a single data driving unit to generate the grayscale voltages. In an embodiment, for example, the display device DD including one single data driving unit may be applied to a mobile phone, etc.

The data driving unit DDC may include a data driving chip DC and a data circuit substrate DCB on which the data driving chip DC is mounted. The data driving chip DC may be provided in plurality, such as in one-to-one correspondence with the data circuit substrates DCB. According to an embodiment, the data circuit substrate DCB may be provided as a flexible printed circuit. The data circuit substrate DCB electrically connects the main circuit substrate PB and the first substrate 100 to each other. The plurality of driving chips DC provide data signals corresponding to data lines among the plurality of data lines DL1 to DLm.

According to an embodiment of the invention, the data circuit substrate DCB may be disposed on a side surface among the side surfaces of the display panel DP, which does not include the gate driving unit GDC. In other words, the data circuit substrate DCB is not disposed on the top surface of the substrate of the display panel DP, but is disposed on a side surface of the display panel DP, and therefore the display area DA of the display panel DP may be increased by the decreased non-display area NDA.

According to an embodiment of the invention, the gate control signal output from the signal control unit SC may be provided to the gate circuit substrate GCB via the data circuit substrate DCB closest to the gate circuit substrate GCB from among data circuit substrates. Referring to FIG. 2, for example, a substrate dummy line BSL may be disposed on the data circuit substrate DCB to be connected to the display panel DP, the substrate dummy line BSL delivering the gate control signal output from the signal control unit SC to the gate circuit substrate GCB via conductive (signal) lines (not shown) disposed within the display panel DP.

The data driving unit DDC is described as provided in plurality, but is not limited thereto. In other words, the data driving unit DDC may also be provided in a single data driving unit to generate the grayscale voltages. In an embodiment, for example, the display device DD including one single data driving unit may be applied to a mobile phone, etc.

Figure 4:
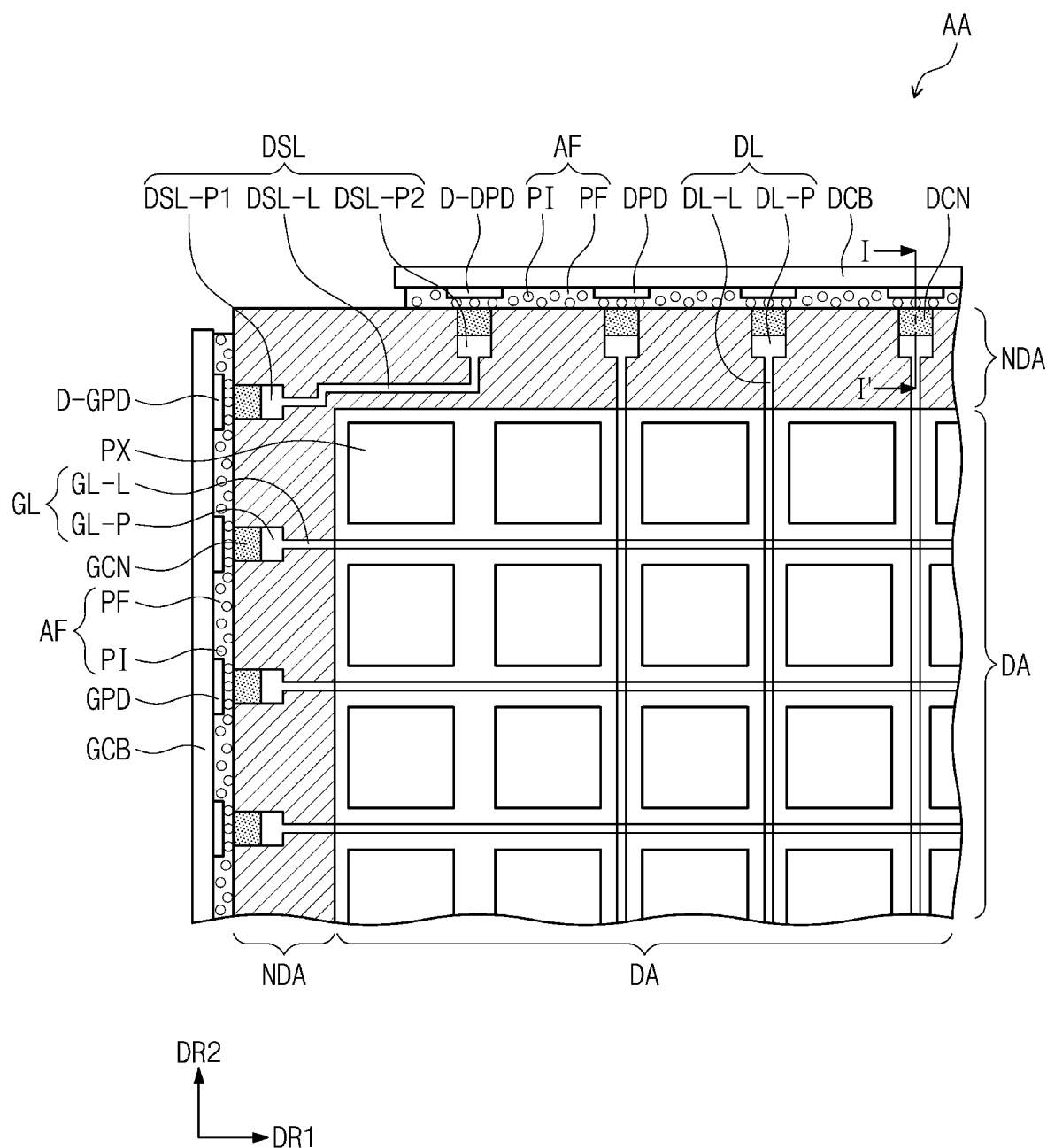
FIG. 4 is an enlarged top plan view of an embodiment of area AA shown in FIG. 3.

FIG. 4 is an enlarged top plan view of an embodiment of the area AA shown in FIG. 3. The top plan view illustrated in FIG. 4 may be a plan view of the first substrate 100 of the display panel DP with the second substrate 200 omitted, for convenience of explanation. The area AA is disposed at an edge portion of the display device DD at an edge portion of the first substrate 100 of the display panel DP.

According to FIG. 4, for convenience of explanation, any one of the gate driving units GDC connected to the display panel DP illustrated in FIG. 2 is shown, and any one of the data driving units DDC is shown. In addition, through FIG. 4, a gate driving chip GC mounted on the gate circuit substrate GCB and a data driving chip DC mounted on the data circuit substrate DCB are omitted for convenience of explanation.

In detail, referring to FIG. 4, the display panel DP may include a plurality of signal lines overlapping the display area DA and the non-display area NDA. Here, the signal lines may include data lines, gate lines and a dummy line.

Each of the gate lines GL may include or define a gate pad (portion) unit GL-P and a gate line (portion) unit GL-L. The gate line unit GL-L overlaps the display area DA and the non-display area NDA. The gate pad unit GL-P overlaps the non-display area NDA and is connected to a terminal end of the gate line unit GL-L.

Each of the data lines DL may include a data pad (portion) unit DL-P and a data line (portion) unit DL-L. The data line unit DL-L overlaps the display area DA and the non-display area NDA. The data pad unit DL-P overlaps the non-display area NDA and is connected to a terminal end of the data line unit DL-L.

The dummy line DSL overlaps the non-display area NDA, and includes a gate dummy pad (portion) unit DSL-P1, a data dummy pad (portion) unit DSL-P2 and a dummy line (portion) unit DSL-L for connecting the gate dummy pad unit DSL-P1 and the data dummy pad unit DSL-P2 to each other. The gate dummy pad unit DSL-P1 is connected to a first end of the dummy line unit DSL-L, and the data dummy pad unit DSL-P2 is connected to a second end of the dummy line unit DSL-L opposing the first end thereof. The data dummy pad unit DSL-P2 may be disposed more closely adjacent to the gate circuit substrate GCB than to the data pad unit DL-P. For convenience of explanation, the dummy line DSL is shown as one, but may be provided in plurality.

The dummy line DSL may be electrically connected to a substrate dummy line BSL (see to FIG. 2) disposed on the data circuit substrate DCB. Accordingly, the dummy line DSL may deliver the gate control signal delivered through the substrate dummy line BSL to the gate circuit substrate GCB. The gate driving chip GC (see to FIG. 2) disposed on the gate circuit substrate GCB may output gate signals corresponding to the gate lines GL in response to the gate control signal delivered through the dummy line DSL.

The gate circuit substrate GCB may be disposed on one of the side surfaces of the display panel DP. In detail, the gate circuit substrate GCB may be disposed on one of side surfaces of the first substrate 100 (see FIG. 1). The gate circuit substrate GCB may include a gate driving pad (portion) unit GPD and a first dummy driving pad (portion) unit D-GPD.

The gate driving pad unit GDP may be provided in plurality in correspondence to the number of the gate lines GL, and the plurality of gate driving pad units GDP are respectively and electrically connected to the gate lines GL. The first dummy driving pad unit D-GPD may be electrically connected to the dummy line DSL to receive the gate control signal. The first dummy driving pad unit D-GDP may be electrically connected to the gate driving chip GC (see FIG. 2). The gate driving chip GC receives the gate control signal through the first dummy driving pad unit D-GPD, and outputs a gate signal corresponding to the gate driving pad unit GDP in response to the gate control signal.

The data circuit substrate DCB may be disposed on another one of the side surfaces of the display panel DP at which the gate circuit substrate GCB is not disposed. The data circuit substrate DCB may include a data driving pad unit DPD and a second dummy driving pad unit D-DPD.

The data driving pad unit DDP may be provided in plurality in order to correspond to the number of the data lines DL, and the plurality of data driving pad units DDP are respectively and electrically connected to the data lines DL. The second dummy driving pad unit D-DPD may be electrically connected to the dummy line DSL to receive the gate control signal from the signal control unit SC. In other words, the gate control signal may be delivered to the dummy line DSL through the second dummy driving pad unit D-DPD.

According to an embodiment of the invention, the first substrate 100 may include a first connection electrode GCN for electrically connecting the gate driving pad unit GPD and the gate pad unit GL-P to each other. The first connection electrode GCN may be provided in plurality for respectively connecting the plurality of gate driving pad units GPD and the plurality of gate pad units GL-P to each other. Here, the plurality of first connection electrodes GCN include a connection electrode for electrically connecting the first dummy driving pad unit D-GPD and the gate dummy pad unit DSL-P1 to each other.

The first connection electrode GCN may be electrically connected with the gate driving pad unit GPD through an anisotropic conductive film AF. The anisotropic conductive film AF includes a conductive particle PI provided in plurality inside an adhesive film PF having adhesiveness. The conductive particles PI electrically conduct the first connection electrode GCN of the first substrate 100 and the gate driving pad unit GPD of the gate driving unit GDC to each other.

The first substrate 100 may include a first etched part defined in the non-display area NDA, to be described later. The first etched part may be disposed or formed on the first substrate 100 to be adjacent to one of the above-described side surfaces of the first substrate 100 at which a driving unit is disposed. The first substrate 100 includes a plurality of first etched parts, and the plurality of first connection electrodes GCN may be respectively disposed on the plurality of first etched parts. In other words, the gate driving pad unit GPD and the gate pad unit GL-P are electrically connected to each other through the first connection electrode GCN disposed on the first etched part. A structure of the first connection electrode GCN will be described in detail in relation to FIGS. 5A and 5B.

According to an embodiment of the invention, the first substrate 100 may include a second connection electrode DCN for electrically connecting the data driving pad unit DPD and the data pad unit DL-P to each other. The second connection electrode DCN may be provided in plurality for respectively connecting the plurality of data driving pad units DPD and the plurality of data pad units DL-P to each other. Here, the plurality of second connection electrodes DCN include a connection electrode for electrically connecting a second dummy driving pad unit D-DPD and the data dummy pad unit DSL-P2 to each other.

The second connection electrode DCN may be electrically connected with the data driving pad unit DPD through the anisotropic conductive film AF. In other words, the conductive particles PI electrically connect the second connection electrode DCN and the data driving pad unit DPD to each other.

The first substrate 100 may include a second etched part defined in the non-display area NDA, to be described later. The second etched part may be disposed or formed on the first substrate 100 to be adjacent to another one of the above-described side surfaces of the first substrate 100 at which a driving unit is disposed. The first substrate 100 includes a plurality of second etched parts, and the plurality of second connection electrodes DCN may be respectively disposed on the plurality of second etched parts. In other words, the data driving pad unit DPD and the data pad unit DL-P are electrically connected to each other through the second connection electrode DCN disposed on the second etched part. Similarly, a structure of the second connection electrode DCN will be described in detail in relation to FIGS. 5A and 5B.

Figure 5A:
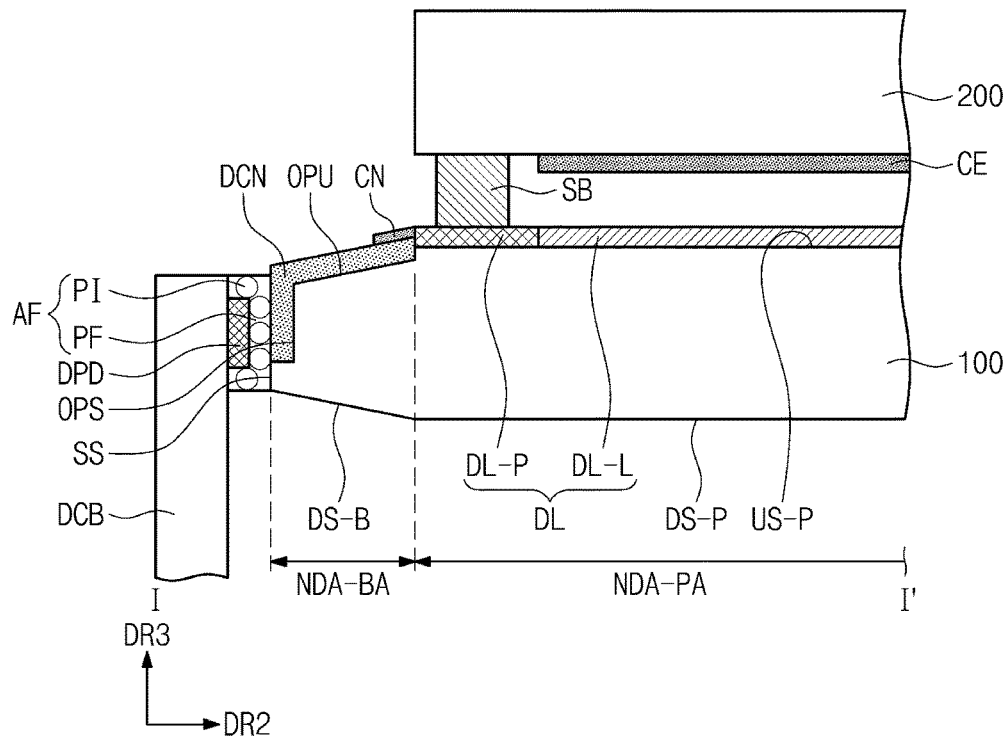
FIG. 5A is a cross-sectional view of the area AA along I-I' shown in FIG. 4 according to the invention.
Figure 5B:
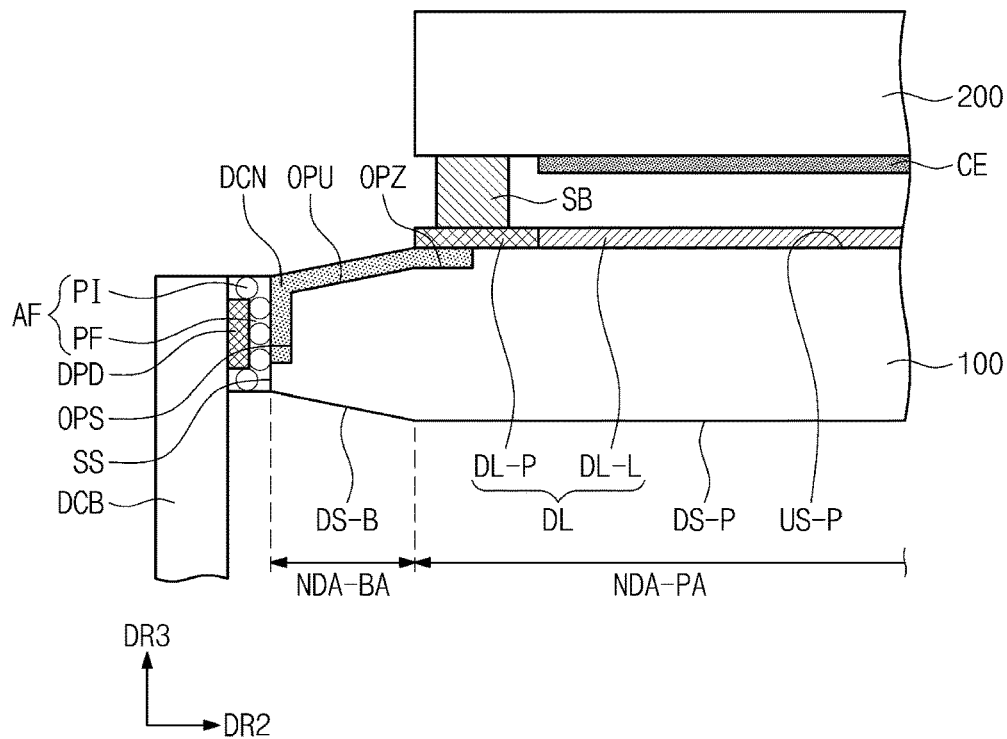
FIG. 5B is a cross-sectional view of a modified embodiment of the area AA along I-I' shown in FIG. 4 according to the invention.

FIG. 5A is a cross-sectional view of an embodiment of the area AA along I-I' shown in FIG. 4 according to the invention. FIG. 5B is a cross-sectional view of a modified embodiment of the area AA along I-I' shown in FIG. 4 according to the invention.

In FIGS. 5A and 5B, a connection structure of any one data line DL illustrated in FIG. 4 and the second connection electrode DCN is illustrated, but the invention is not limited thereto. In other words, each of the plurality of gate lines GL and the plurality of data lines DL may be connected to a respective connection electrode in the connection structure illustrated in FIGS. 5A and 5B.

In detail, referring to FIG. 5A, the first substrate 100 includes an upper surface US, a lower surface DS facing the upper surface US, and a side surface SS for connecting the upper surface and the lower surface to each other. Here, the side surface SS may correspond to the above-described side surface from among the side surfaces of the first substrate 100 at which the data driving unit DDC is disposed.

The upper surface US may include the display area DA at which an image is actually displayed and the non-display area NDA at which the image is not displayed. In particular, the upper surface US includes or is defined by a horizontal (portion) part US-P perpendicular to the third direction DR3 and parallel to the second direction DR2, and a diagonal (inclined portion) part US-B (see FIG. 6B) which is inclined from the horizontal part US-P and connected to the side surface SS. A maximum thickness of the first substrate 100 may be defined at the horizontal part US-P.

The horizontal part US-P may overlap or be disposed in the display area DA and the non-display area NDA, and the diagonal part US-B may overlap the non-display area NDA. In particular, the non-display area NDA illustrated in FIG. 5A may include a horizontal area NDA-PA and a diagonal area NDA-BA. The data pad unit DL-P and a data line unit DL-L may be disposed on the upper surface US overlapping the horizontal area NDA-PA.

According to an embodiment of the invention, the diagonal part US-B (see FIG. 6B) may be etched to a certain depth in the third direction DR3 along the thickness direction of the first substrate 100, with reference to the horizontal part US-P. Hereinafter, the resulting part at which the diagonal part US-B has been etched will be described as an upper surface etched part OPU. The upper surface etched part OPU forms a step with the horizontal part US-P. The second connection electrode DCN may be disposed at the upper surface etched part OPU to electrically contact the data pad unit DL-P. In other words, the second connection electrode DCN may not be disposed at the original (un-etched) diagonal part US-B which overlaps the diagonal area NDA-BA, but is disposed on the resulting upper surface etched part OPU as being an etched portion of the substrate 100 at the diagonal part US-B. That is, the upper surface etched part OPU is an etched surface of the first substrate 100 recessed from the horizontal part US-P, to form a step with the horizontal part US-P.

The lower surface DS includes a first part DS-P perpendicular to the third direction DR3 and parallel to the second direction DR2, and includes a second part DS-B which is inclined from the first part DS-P. Here, the first part DS-P may face the horizontal part US-P and be symmetric to each other on the basis of the second direction DR2. The second part DS-B may face the diagonal part US-B and be symmetric to each other on the basis of the second direction DR2.

As described above, the non-display area NDA of the first substrate 100 includes the horizontal area NDA-PA and the diagonal area NDA-BA. In a conventional structure, when an external impact is applied to the horizontal area of the display device DD, the impact may be applied to both of the first substrate 100 and the second substrate 200 and a displaying surface may be damaged.

However, the display device DD according to one or more embodiment of the invention, when a relatively strong external impact is applied to the diagonal area NDA-BA of the display device DD, the external impact may be concentrated on the diagonal area NDA-BA to be reduced or effectively prevented from being delivered to the horizontal area NDA-PA. As a result, the display surface corresponding to the display area DA at which an image is displayed may be generally protected.

According to an embodiment of the invention, the side surface SS may connect the diagonal part US-B and the second part DS-B to each other. The side surface SS of the first substrate 100 (see FIG. 6B) may be etched to a certain depth in the second direction DR2 that is perpendicular to the thickness direction of the first substrate 100. Hereinafter, the resulting part at which the side surface SS has been etched will be described as a side surface etched part OPS. That is, side surface etched part OPS is an etched surface of the first substrate 100 recessed from the side surface SS, to form a step with the side surface SS. The upper side surface etched part OPU may have a shape that is extended from the side surface etched part OPS. The second connection electrode DCN may be further disposed at the side surface etched part OPS and electrically connected to the data driving pad unit DPD through the anisotropic conductive film AF. The second connection electrode DCN is exposed outside the first substrate 100 at both the upper side surface etched part OPU and the side surface etched part OPS.

In other words, the second connection electrode DCN is disposed as a unified shape along the upper surface etched part OPU and the side surface etched part OPS. A first end of the second connection electrode DCN electrically contacts the data pad unit DL-P, and a second end of the second connection electrode DCN opposite to the first end thereof is electrically connected to the data driving pad unit DPD through the isotropic conductive film AF.

In addition, according to an embodiment of the invention, an auxiliary connection electrode CN may be disposed on the second connection electrode DCN which overlaps the diagonal area NDA-BA. In other words, the auxiliary connection electrode CN is disposed on the second connection electrode DCN to make electrical connection of the second connection electrode DCN and the data pad unit DL-P easier. However, the second connection electrode DCN may be omitted according to an embodiment.

The second substrate 200 is disposed on the first substrate 100 so as to face the horizontal part US-P of the upper surface US of the first substrate 100. A common electrode CE providing a common voltage to pixels PX shown in FIG. 2 and a color filter (not shown), etc., may be disposed on the second substrate 200. As an example, the common electrode CE and the color filter are described as disposed on the second substrate 200 in relation to FIGS. 5A and 5B, but the invention is not limited thereto. In other words, the common electrode CE and the color filter may be disposed on the first substrate 100.

A substrate combining member SB may overlap the horizontal area NDA-PA and be disposed between the first substrate 100 and the second substrate 200. The substrate combining member SB may have a frame shape in the top plan view so as to overlap the horizontal area NDA-PA and be disposed between the first substrate 100 and the second substrate 200 at all sides of the display device DD. The substrate combining member SB may be an adhesive member, without being limited thereto, and functions to couple the first and second substrates 100 and 200 to each other.

In comparison with FIG. 5A, in FIG. 5B, the structure of the auxiliary etched part obtained by etching the horizontal part US-P of the upper surface US to a certain depth in the third direction DR3 is further disclosed, but the remaining structure may be substantially the same.

In detail, referring to FIG. 5B, the horizontal part US-P overlaps the horizontal area NDA-PA and includes the auxiliary etched part OPZ as a result of the first substrate 100 at the horizontal part US-P thereof being etched to a certain depth in the third direction DR3.

The second connection electrode DCN is further disposed on the auxiliary etched part OPZ. In other words, the second connection electrode DCN may be disposed in a unified shape along the side surface etched part OPS, the upper surface etched part OPU and the auxiliary etched part OPZ. In particular, one area of the data pad unit DL-P overlaps the auxiliary etched part OPZ in the third direction DR3 and one area of the data pad unit DL-P is disposed on the second connection electrode DCN.

FIGS. 6A to 6E are cross-sectional views showing an embodiment of a manufacturing method of a display device according to the invention.

Figure 6A:
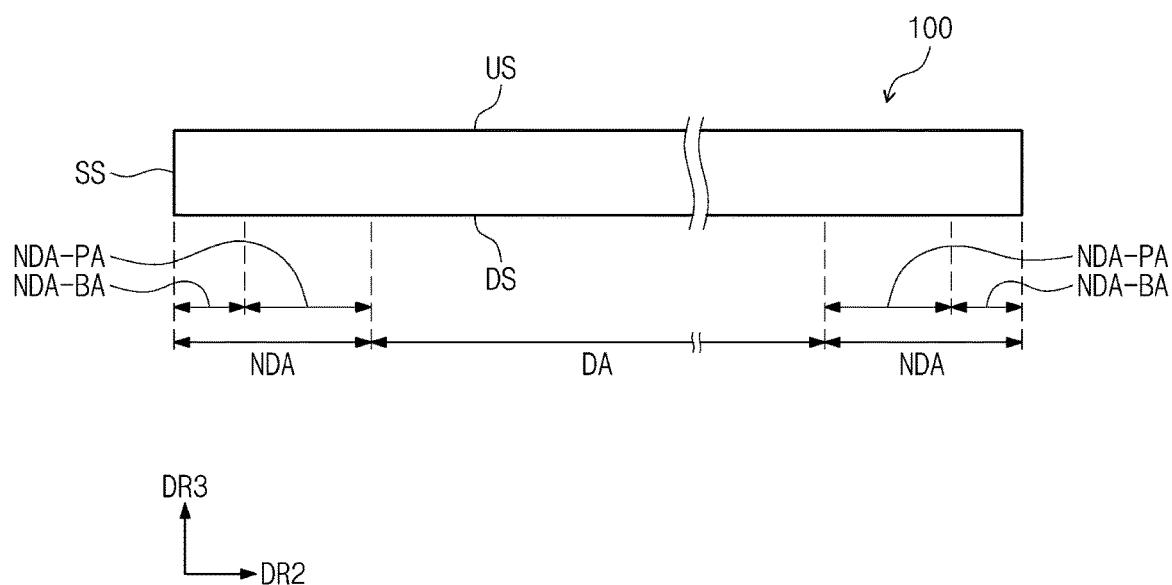
FIGS. 6A to 6E are cross-sectional views showing an embodiment of a manufacturing method of a display device according to the invention.

Referring to FIG. 6A, the first substrate 100 is provided which initially includes the upper surface US, the lower surface DS and the side surfaces SS. As described above in relation to FIG. 5A, the first substrate 100 includes the display area DA and the non-display area NDA, and the non-display area NDA includes portions corresponding to the horizontal area NDA-PA and the diagonal area NDA-BA. As an example, in the top plan view, the horizontal area NDA-PA encloses the display area DA and the diagonal area NDA-BA encloses the horizontal area NDA-PA. As another example, the non-display area NDA may not be disposed at all sides of the display area DA so as to not enclose the display area DA, but may be disposed adjacent to only one side of the display area DA.

Figure 6B:
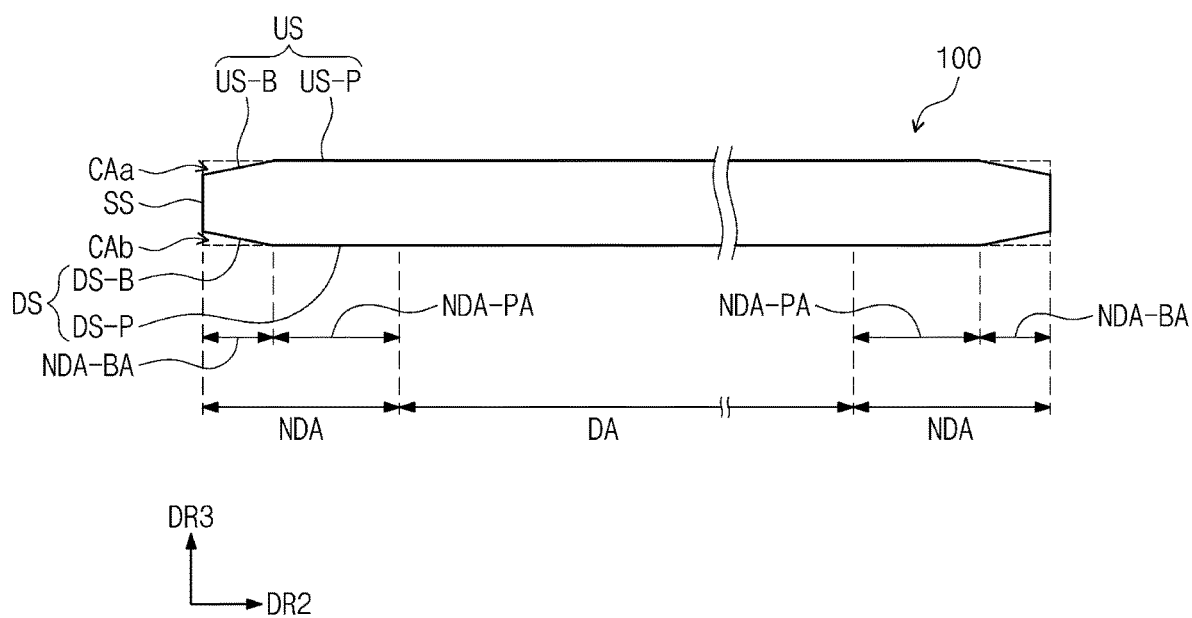

Referring to FIG. 6B, portions CAa and CAb of the first substrate 100 at the upper surface US and the lower surface DS of the first substrate 100, which overlap the diagonal area NDA-BA, are removed. As a result, in the third direction DR3, a thickness of the first substrate 100 at the diagonal area NDA-BA may be different from a thickness of the first substrate 100 at the display area DA and at the horizontal area NDA-PA. In the third direction DR3, thicknesses of the first substrate 100 at the display area DA and at the horizontal area NDA-PA may be the same.

Accordingly, the upper surface US may be modified by etching to include the horizontal part US-P overlapping the display area DA and the horizontal area NDA-PA, and the diagonal part US-B overlapping the diagonal area NDA-BA. In this case, the diagonal part US-B may be provided in a shape inclined from the horizontal part US-P and connecting the horizontal part US-P and the side surface SS to each other. In other words, a total thickness of the first substrate 100 at the diagonal part US-B may be reduced in a direction towards the side surface SS from the horizontal area NDA-PA.

The lower surface DS may be modified to include the first part DS-P overlapping the display area DA and the horizontal area NDA-PA, and the second part DS-B overlapping the diagonal area NDA-BA. In this case, the second part DS-B may be provided in a shape inclined from the first part DS-P and connecting the first part DS-P and the side surface SS to each other. In other words, the total thickness of the second part DS-B may be reduced in a direction towards the side surface SS from the first part DS-P.

The diagonal part US-B and the second part US-B may be symmetric with reference to a virtual line extended along the second direction DR2. In addition, as shown in FIG. 6B, the diagonal part US-B and the second part DS-B are shown in a straight line shape, but are not limited thereto. In an embodiment, for example, the diagonal part US-B and the second part US-B may be provided in various shapes such as a curved line shape. The side surface SS is also shown in a straight line shape, but is not limited thereto and may be provided in various shapes such as a curve line.

Figure 6C:
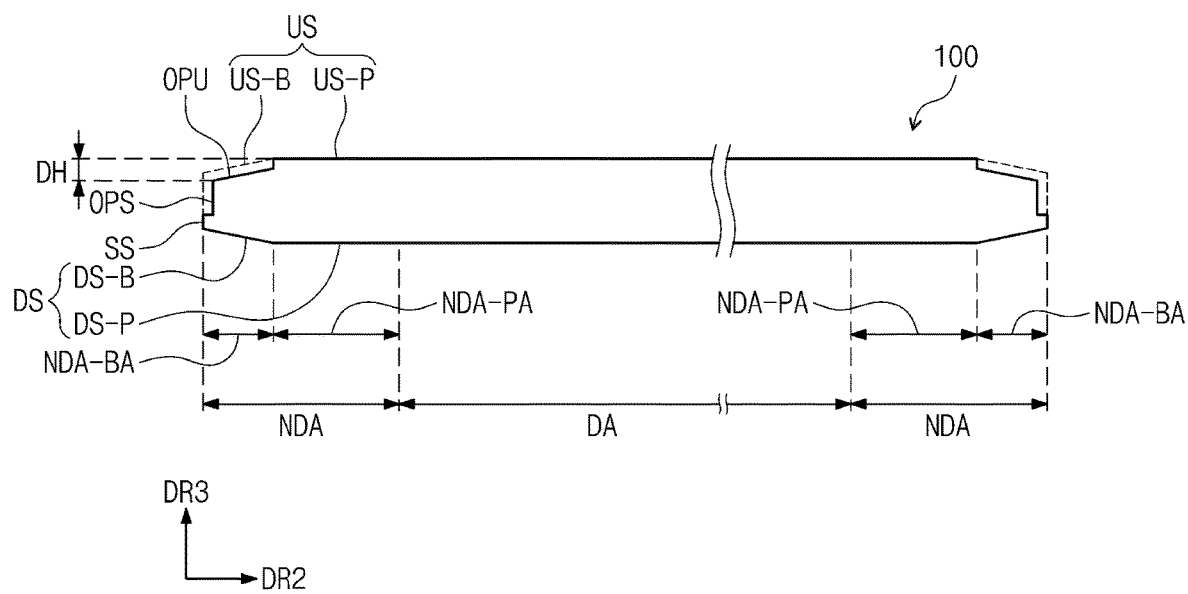

Referring to FIG. 6C, the first substrate 100 may be further etched at the diagonal part US-B (shown in dotted line) of the upper surface US to a certain depth along the third direction DR3 from the horizontal part US-P. The first substrate 100 may also be etched at the side surface SS thereof to a certain depth along the second direction DR2 from the side surface SS. FIG. 6C shows that not the entire area, but a part of the side surface SS extended in the third direction DR3 is etched along the second direction DR2. An un-etched portion of the side surface SS forms a step shape with the side surface etched part OPS. However, the invention is not limited thereto, and the entire area of the side surface SS in the third direction DR3 may be etched to a certain depth, such that no step shape is formed.

As a result, as the diagonal part US-B of the first substrate 100 is further etched, the upper surface US may be modified to include the horizontal part US-P and the upper surface etched part OPU. In addition, the side surface SS is modified to include the side surface etched part OPS and a remaining un-etched portion of the side surface SS.

Figure 6D:
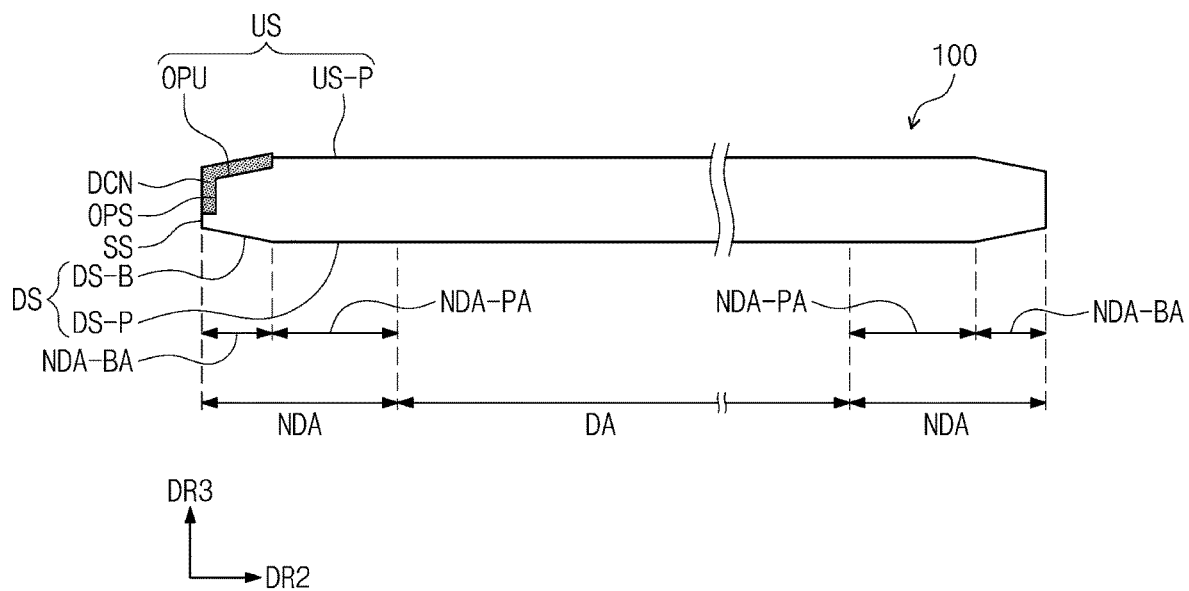

Referring to FIG. 6D, the second connection electrode DCN may be disposed in a unified shape along the upper surface etched part OPU and the side surface etched part OPS. Here, the second connection electrode DCN may be formed from a metal material including such as copper (Cu), silver (Ag), gold (Au) or aluminum (Al).

In addition, as a method for forming the second connection electrode DCN along the upper etched part OPU and the side surface etched part OPS, various methods such as a method for forming an electrode through a laser after metal material deposition, or a silk screen method may be adopted.

Figure 6E:
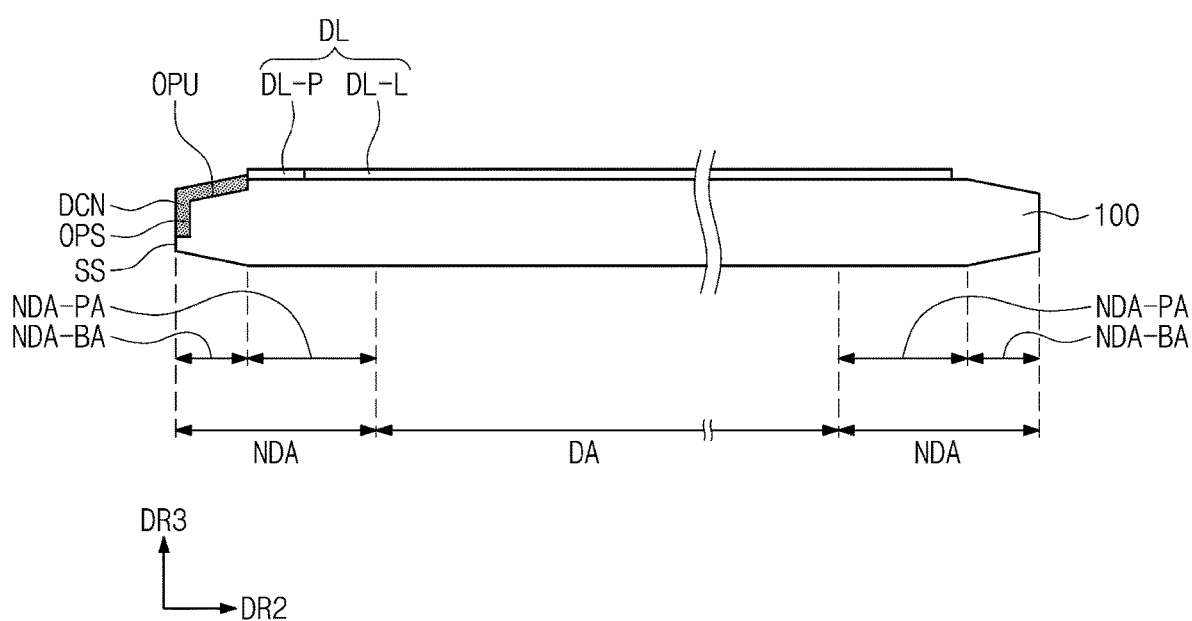

Referring to FIG. 6E, any one data line DL from among the signal lines is disposed at the horizontal part US-P. The data pad unit DL-P is electrically connected to the second connection electrode DCN and is disposed on the horizontal part US-P so as to overlap the horizontal area NDA-PA. The data line unit DL-L is electrically connected to the data pad unit DL-P and is disposed on the horizontal part US-P so as to overlap the horizontal area NDA-PA and the display area DA.

Figure 7:
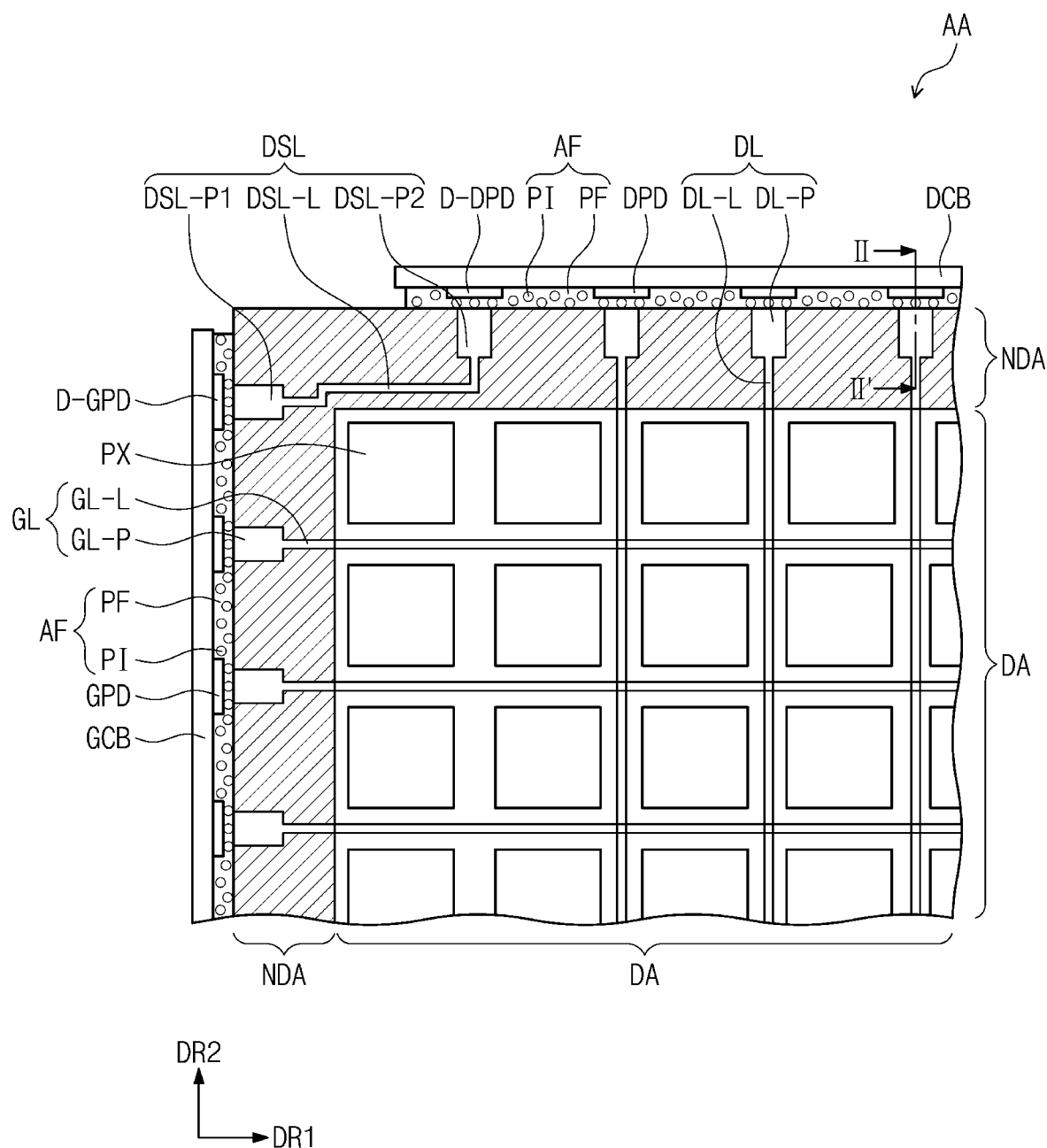
FIG. 7 is an enlarged top plan view of another embodiment of the area AA area shown in FIG. 3 according to the invention.
Figure 8:
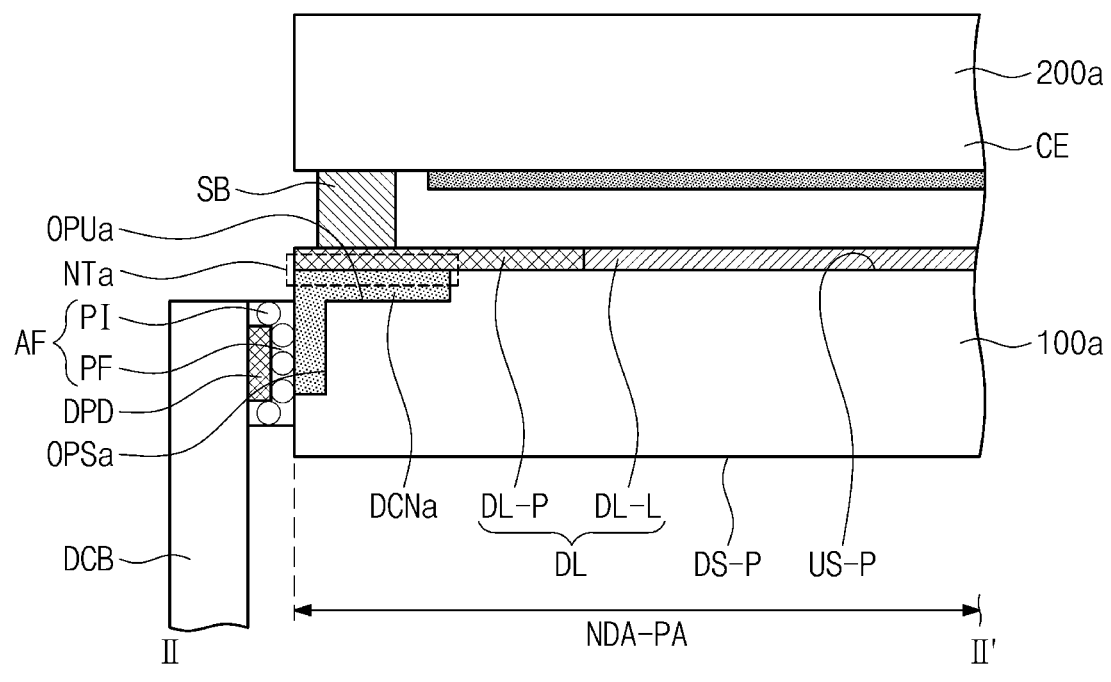
FIG. 8 is a cross-sectional view of the area AA along II-IF shown in FIG. 7 according to the invention.

FIG. 7 is an enlarged top plan view of another embodiment of area AA shown in FIG. 3 according to the invention. FIG. 8 is a cross-sectional view of the area AA along II-II' shown in FIG. 7.

In comparison with the top plan view of the first substrate 100 illustrated in FIG. 4, a top plan view of the first substrate 100 illustrated in FIG. 7 does not disclose a configuration of the connection electrodes GCN and DCN, but the remaining structure and operation scheme may be the same. Accordingly, a description thereabout will be omitted.

Referring to FIG. 8, in comparison with the first substrate 100 illustrated in FIG. 5A, a first substrate 100a has a diagonal area NDA-BA different therefrom, but the remaining structure and operation scheme may be substantially the same.

According to FIG. 8, the first substrate 100a at the non-display area NDA is illustrated. In other words, the non-display area NDA of FIG. 8 may be implemented only with the horizontal area NDA-PA illustrated in FIG. 5A and excluding the diagonal area NDA-BA thereof.

According to an embodiment of the invention, a portion of the first substrate 100a adjacent to a side surface SS may be etched to a certain depth in the third direction DR3 from an upper surface US (see FIG. 6A) of the first substrate 100a. The first substrate 100a may also be etched from the side surface SS (see FIG. 6A) to a certain depth along the second direction DR2. Hereinafter, a resulting part of the first substrate 100a which has been etched from the upper surface US will be described as an upper surface etched part OPUa and a resulting part of the first substrate 100a which has been etched from the side surface SS will be described as a side surface etched part OPSa. The upper (horizontal) surface etched part OPUa forms a step with the horizontal part US-P.

The connection electrode DCNa is disposed in a unified shape along the upper surface etched part OPUa and the side surface etched part OPSa. The connection electrode DCNa is described as disposed in an etched part of the first substrate 100 in a unified shape, but is not limited thereto. In other words, the connection electrode DCNa may be disposed at the various etched parts of the first substrate 100a in a divided structure (e.g., as a collection of separate portions) as an overall structure for electrically connecting the circuit substrate and the signal pad unit.

The data pad unit DL-P may be disposed to directly and electrically contact the connecting electrode DCNa. In other words, at least one area NTa (dotted line box) of the data pad unit DL-P may overlap the connection electrode DCNa in the third direction DR3.

In comparison with the non-display area NDA of the first substrate 100 illustrated in FIG. 5A, a width of the non-display area NDA of the first substrate 100a illustrated in FIG. 8 may be further reduced as including the connection electrode DCNa within a boundary of a second substrate 200a facing the first substrate 100a and the first substrate 100a excluding the diagonal area NDA-BA. For the first substrate 100 of FIG. 5A, the connection electrode DCN is disposed on the diagonal area NDA-BA, but for the first substrate 100a of FIG. 8, the connection electrode DCNa may be directly disposed on the horizontal area NDA-PA to overlap the data pad unit DL-P. Accordingly, the first substrate 100a may include the non-display area NDA reduced by the diagonal NDA-BA of FIG. 5A.

Figure 9:
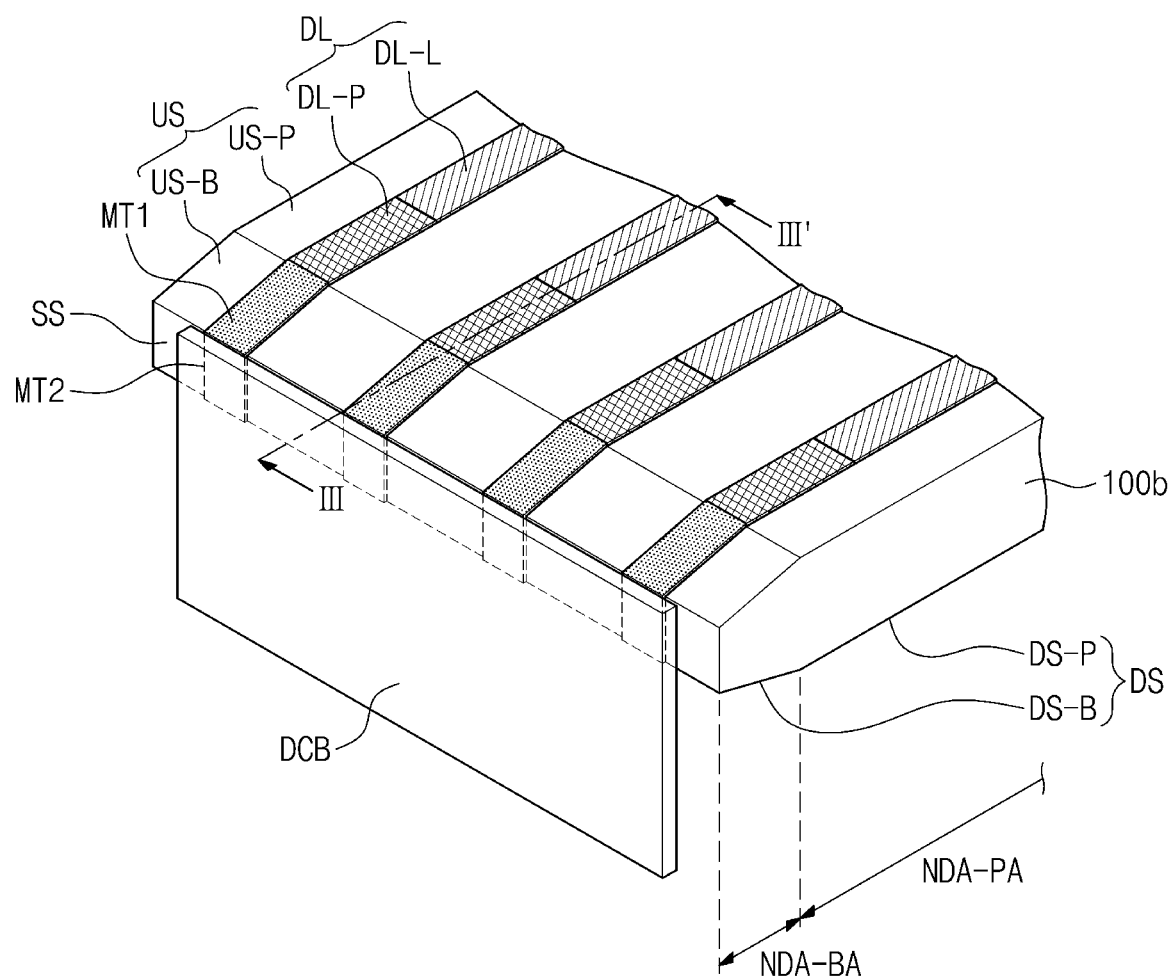
FIG. 9 is an enlarged cross-sectional view of another embodiment of a display device according to the invention.
Figure 10:
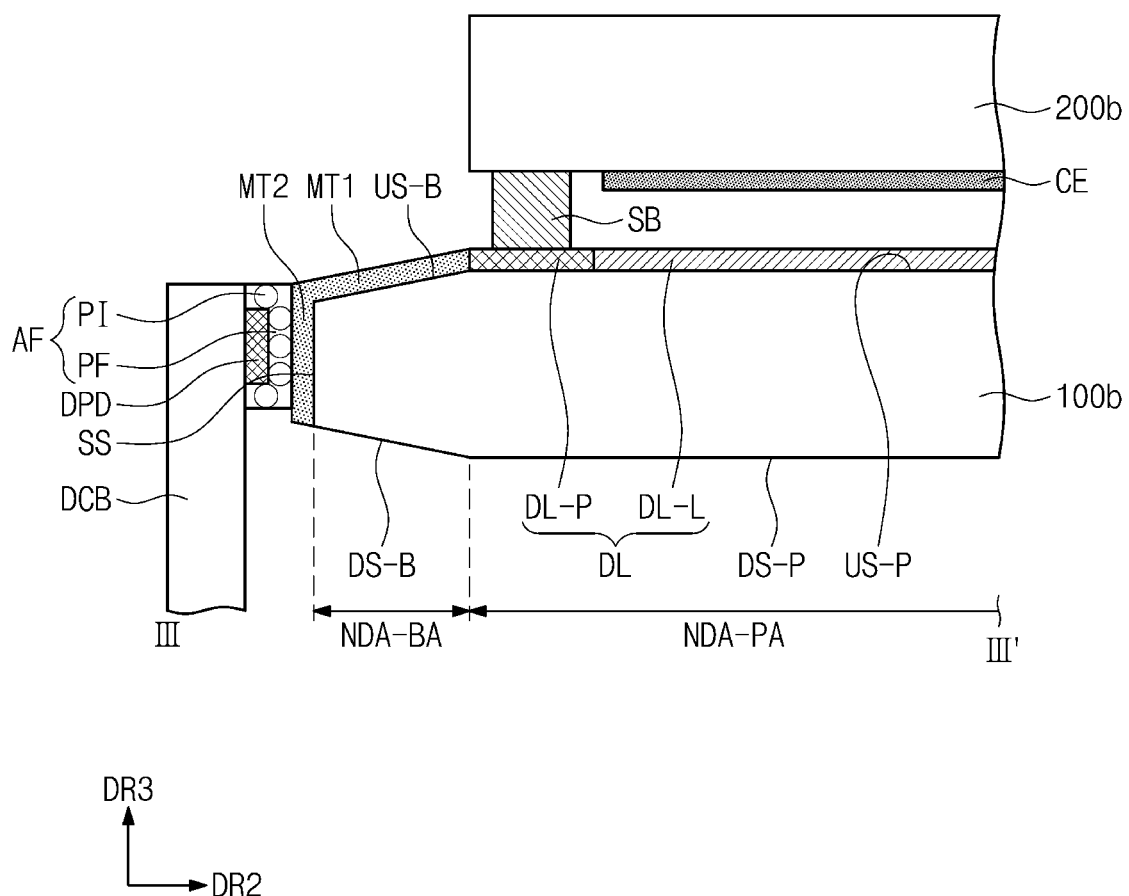
FIG. 10 is a cross-sectional view of the display device along shown in FIG. 9.

FIG. 9 is an enlarged cross-sectional view of another embodiment of a display device according to the invention. FIG. 10 is a cross-sectional view of the display device along III-III' shown in FIG. 9.

Referring to FIGS. 9 and 10, a part of the first substrate 100b in the non-display area NDA is illustrated.

The non-display area NDA of the first substrate 100b includes the horizontal area NDA-PA and the diagonal area NDA-BA. In an embodiment, for example, the first substrate 100b illustrated in FIG. 9 may be provided in a shape of the first substrate 100 illustrated in FIG. 6B. The second substrate 200b faces the horizontal area NDA-PA and the display area DA of the first substrate 100b.

In comparison with the first substrate 100 illustrated in FIG. 5A, the first substrate 100b illustrated in FIG. 9 does not include a separate etched part in the diagonal area NDA-BA. That is, the surfaces of the first substrate 100 illustrated in FIG. 6B may not be further etched to maintain the upper surface US and the lower surface DS as illustrated in FIG. 6B.

According to an embodiment of the invention, on the diagonal part US-B of the upper surface US, diagonal connection electrodes MT1 may be respectively disposed to correspond to the number of data pad units DL-P. The diagonal part US-B is extended directly from the horizontal part US-P such that no step is formed therebetween. The diagonal connection electrodes MT1 respectively and electrically contact the data pad units DL-P. In addition, on the side surface SS, side surface connection electrodes MT2 may respectively disposed to be electrically connected to the diagonal connection electrodes MT1. The side surface connection electrodes MT2 may be electrically connected with the data driving pad units DPD included on the data circuit substrate DCB through the anisotropic conductive film AF. The diagonal connection electrode MT1 and the side surface connection electrode MT2 may be provided in a unified shape or be separate elements connected to each other.

As a method for forming the diagonal connection electrodes MT1 on the diagonal part US-B and a method for forming the side surface connection electrodes MT2 on the side surface SS, a method for forming an electrode through a laser after deposition of a metal material or a silk screen method, etc. may be variously adopted.

According to one or more embodiment of the invention, a substrate of a display panel may include an etched area in a non-display area thereof. In particular, a connection electrode for electrically contacting a signal-providing circuit substrate and a signal pad of the display panel may be disposed in the etched area. In addition, a bezel of the display device may be generally reduced, since a signal-providing circuit substrate pad is disposed on a side surface of the substrate, not on an upper surface thereof.

As described above, the embodiments are disclosed in the drawings and specification. Herein, specific terms have been used, but are just used for the purpose of describing the invention and are not used for defining the meaning or limiting the scope of the invention, which is disclosed in the appended claims. The above-disclosed subject matter is to be considered illustrative and not restrictive, and the appended claims are intended to cover all such modifications, enhancements, and other embodiments, which fall within the true spirit and scope of the invention. Thus, to the maximum extent allowed by law, the scope of the invention is to be determined by the broadest permissible interpretation of the following claims and their equivalents, and shall not be restricted or limited by the foregoing detailed description.

What is claimed is:

1. A display device comprising:
   a substrate of a display panel including a display area in which an image is displayed and a non-display area adjacent to the display area, the substrate comprising:
   an upper surface disposed in both the display area and the non-display area,
   a lower surface facing the upper surface, disposed in both the display area and the non-display area, and
   a plurality of side surfaces connecting the upper surface and the lower surface to each other;
   a signal line which receives a signal at the non-display area and provides the received signal to the display area, the signal line disposed on the upper surface of the substrate;
   a circuit substrate from which the signal is provided to the signal line, the circuit substrate disposed on a side surface among the side surfaces of the substrate; and
   a connection electrode disposed on the upper surface of the substrate in the non-display area thereof, wherein the connection electrode electrically connects the signal line and the circuit substrate to each other,
   wherein in the non-display area,
   the substrate further comprises:
   a first etched portion recessed from the side surface at which the circuit substrate is disposed, and
   a second etched portion extending from the first etched portion toward the signal line, and
   the connection electrode is disposed in the first etched portion and the second etched portion.

2. The display device according to claim 1, wherein in the non-display area,
   the upper surface comprises a horizontal portion on which the signal line is disposed, the horizontal portion disposed in a plane defined by first and second directions, and
   the second etched portion in which the connection electrode is disposed is inclined from the horizontal portion to the first etched portion.

3. The display device according to claim 2, wherein in the non-display area, the lower surface comprises:
   a first portion facing the horizontal portion of the upper surface, and
   a second portion inclined from the first portion and connecting the first portion to the side surface at which the circuit substrate is disposed.

4. The display device according to claim 2, further comprising, in the non-display area:
   an auxiliary connection electrode disposed on the connection electrode and electrically contacting the signal line and the connection electrode.

5. The display device according to claim 2, wherein in the non-display area,
   the substrate further comprises an auxiliary etched portion extended from the inclined second etched portion to the signal line, the auxiliary etched portion recessed from the horizontal portion in the thickness direction, and
   the connection electrode disposed in the second etched portion is further disposed in the auxiliary etched portion.

6. The display device according to claim 5, wherein in the non-display area, the signal line disposed on the horizontal portion of the upper surface extends to be disposed on the connection electrode disposed in the auxiliary etched portion.

7. The display device according to claim 2, wherein in the thickness direction, the second etched portion is recessed from the horizontal portion of the upper surface and extends from the horizontal portion to terminate at the side surface at which the circuit substrate is disposed.

8. The display device according to claim 1, wherein in the non-display area,
   the signal line comprises a pad at a terminal end thereof, the pad being adjacent to the side surface at which the circuit substrate is disposed, and a conductive line which is connected to the pad and extends to the display area, and
   the pad of the signal line is disposed on the connection electrode disposed in the second etched portion.

9. The display device according to claim 8, wherein the circuit substrate comprises a pad through which the signal is provided from the circuit substrate to the pad of the signal line, and
   at the first etched portion, the pad of the circuit substrate is electrically connected to and faces the connection electrode.

10. The display device according to claim 9, further comprising at the first etched portion:
    an isotropic conductive film disposed between the pad of the circuit substrate and the connection electrode.

11. The display device according to claim 1, further comprising:

an upper substrate facing the substrate on which the signal line is disposed, and a substrate combining member which couples the upper substrate to the substrate on which the signal line is disposed, wherein at the second etched portion, the signal line is disposed between the connection electrode and the substrate combining member.

12. A display device comprising:

a substrate of a display panel including a display area in which an image is displayed and a non-display area adjacent to the display area, the substrate comprising:

an upper surface disposed in both the display area and the non-display area, a lower surface facing the upper surface, disposed in both the display area and the non-display area, and a plurality of side surfaces connecting the upper surface and the lower surface to each other;

a signal line which receives a signal at the non-display area and provides the received signal to the display area, the signal line disposed on the upper surface of the substrate;

a circuit substrate from which the signal is provided to the signal line, the circuit substrate disposed on a side surface among the side surfaces of the substrate; and a connection electrode disposed on the upper surface of the substrate in the non-display area thereof, wherein the connection electrode electrically connects the signal line and the circuit substrate to each other, wherein in the non-display area, the upper surface comprises a horizontal portion, and an inclined portion which is inclined from the horizontal portion and connects the horizontal portion and the side surface on which the circuit substrate is disposed to each other, the signal line is disposed on the horizontal portion of the upper surface, and the connection electrode is disposed on the inclined portion of the upper surface and extends toward the lower surface along the side surface on which the circuit substrate is disposed.

13. The display device according to claim 12, wherein in the non-display area, the lower surface comprises:

a first portion facing the horizontal portion, and a second portion inclined from the first portion and connecting the first portion and the side surface to each other.

14. The display device according to claim 12, wherein in the non-display area, the signal line comprises a pad at a terminal end thereof, the pad contacting the connection electrode, and a conductive line which is connected to the pad and extends to the display area, and an end surface of the connection electrode faces and contacts an end surface of the pad of the signal line.

15. The display device according to claim 12, wherein the circuit substrate comprises a pad electrode through which the signal is provided from the circuit substrate to the signal line, and the pad electrode is electrically connected to and faces the connection electrode disposed on the side surface.

16. The display device according to claim 15, further comprising:

a conductive adhesive member disposed between the pad electrode of the circuit substrate and the connection electrode disposed on the side surface.

* * * * *